United States Patent [19]

Inoue

[11] Patent Number: 4,789,776
[45] Date of Patent: Dec. 6, 1988

[54] IC CARD
[75] Inventor: Takesi Inoue, Itami, Japan
[73] Assignee: Mitsubishi Denki Kabushiki Kaisha, Japan
[21] Appl. No.: 124,556
[22] Filed: Nov. 24, 1987
[30] Foreign Application Priority Data Nov. 27, 1986 [JP] Japan .............................. 61-182191

[51] Int. Cl.⁴ ............................................ G06K 19/06
[52] U.S. Cl. ..................................... 235/492; 235/487
[58] Field of Search ................................ 235/487, 492

[56] References Cited
U.S. PATENT DOCUMENTS 4,719,140  1/1988  Hara .................................... 235/492

Primary Examiner—Harold I. Pitts
Attorney, Agent, or Firm—Leydig, Voit & Mayer

[57] ABSTRACT

An IC module having a circuit board with obverse and reverse sides on which IC chips are mounted. This IC module is provided with at least one pair of IC chips having inverted operating circuit patterns and mounted back-to-back on the obverse and reverse sides of the circuit board at desired positions such that the inverted operating circuit pattern of one chip coincides with that of the other as seen through the circuit board, at least one printed circuit board pattern corresponding to one of the operating circuit patterns and formed on one of the obverse or reverse sides of the circuit board and used in common for the pairs of IC chips, wire-bonding pads formed around the peripheries of each of the pair of IC chips to connect the circuit board pattern to the terminals of the pair of IC chips, at least one board through hole for connecting the wire-bonding pads on one side of the circuit board to the other, and a pair of selecting signal lines provided for the pair of IC chips. Further, it is possible to form independent or separated circuit board patterns which are for different objects on both the obverse and reverse sides of the circuit board, respectively, and use them in common for both sides thereof.

4 Claims, 2 Drawing Sheets

IC CARD

BACKGROUND OF THE INVENTION

Field of the Invention

This invention relates to an IC card and, more particularly, to a printed circuit on a circuit board which is embedded in the IC card and to circuit patterns of IC chips mounted on that circuit board.

FIG. 1 diagrammatically shows a plan view of an IC card 1 having an IC module 10 embedded in a card main body 1a.

FIG. 2 shows an exploded perspective view of the IC module 10. As shown in FIG. 2, a circuit board 100 has printed circuit patterns 110a and 110b respectively formed on an upper face 101a and a lower face 101b thereof. IC chips 103a and 103b having corresponding wire-bonding pads 104a and 104b are mounted on the upper face 101a and the lower face 101b, respectively. The IC chips 103a and 103b are die-bonded on die-bond areas 105a and 105b. Further, wire-bonding pads 106a and 106b for wire-bonding to the wire-bonding pads 104a and 104b of the IC chips 103a and 103b are also formed on both faces 101a and 101b respectively.

If the IC card is used as, for example, an information memory card, it is necessary to design the IC card so that the thickness is reduced and the memory capacity increased. Attempts have been made to satisfy these requirements and realize a low-cost card by mounting a plurality of IC chips on both sides of a circuit board, as shown in FIG. 2. However, if a pair of IC chips of the same type and same function are mounted on both sides of a circuit board, the printed circuit patterns 110a and 110b on the upper side 101a and the lower side 101b exhibit inverted patterns around the IC chips, as shown in FIG. 2.

For this reason, the dispositions of the bonding pads and the printed circuit patterns around the portions of the circuit board 100 on which the IC chips 103a and 103b are mounted need to be made independently with respect to the upper and lower sides. It is not possible to use a common circuit pattern for both sides. Therefore, if a plurality of IC chips are mounted on both sides, the printed circuit patterns become complicated, which obstructs high-density packaging. To attain an even greater memory capacity, it is necessary to use a multilayer circuit board such as a 3- or 4-layer board. This not only goes against the above requirements for reduction in thickness but also causes production costs to be increased.

Thus, the conventional type of circuit board for IC modules is unsatisfactory in that it cannot be designed to allow an increased packaging density of ICs having the same functions (of the same type) or reductions in thickness of the IC module and IC card since it is not possible to use common patterns together because the patterns on the two sides of the board differ from each other or are inverted with each other.

SUMMARY OF THE INVENTION

It is therefore an object of the present invention to provide an IC card which overcomes the above-described disadvantages and which can be produced at a low cost to provide an increased packaging density and a reduced thickness.

To this end, the present invention provides an IC card in which a pair of IC chips performing the same functions but having inverted circuit patterns relative to one another are mounted on upper and lower sides of the circuit board.

In accordance with the present invention, since IC chips having inverted circuit patterns are mounted in a back to back relationship, a common pattern can be used for both sides of the circuit board. Further, bonding pads formed on the circuit board can also be used in common for both sides except, if necessary, for the pads and lines for IC chip selecting signals, thereby enabling high-density packaging and a reduction in thickness in the case of simple wiring patterns.

DESCRIPTION OF THE PREFERRED EMBODIMENT

Figure 1:
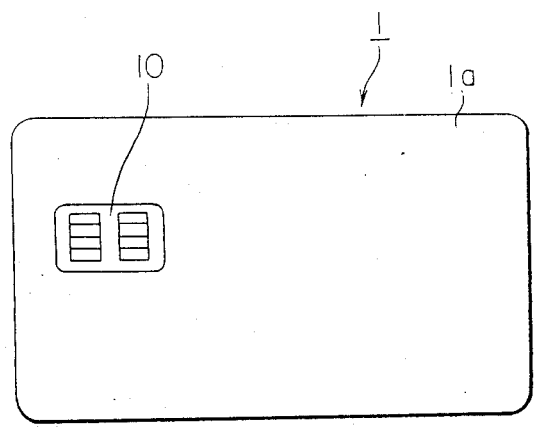
FIG. 1 is a diagrammatic plan view of an IC card.
Figure 2:
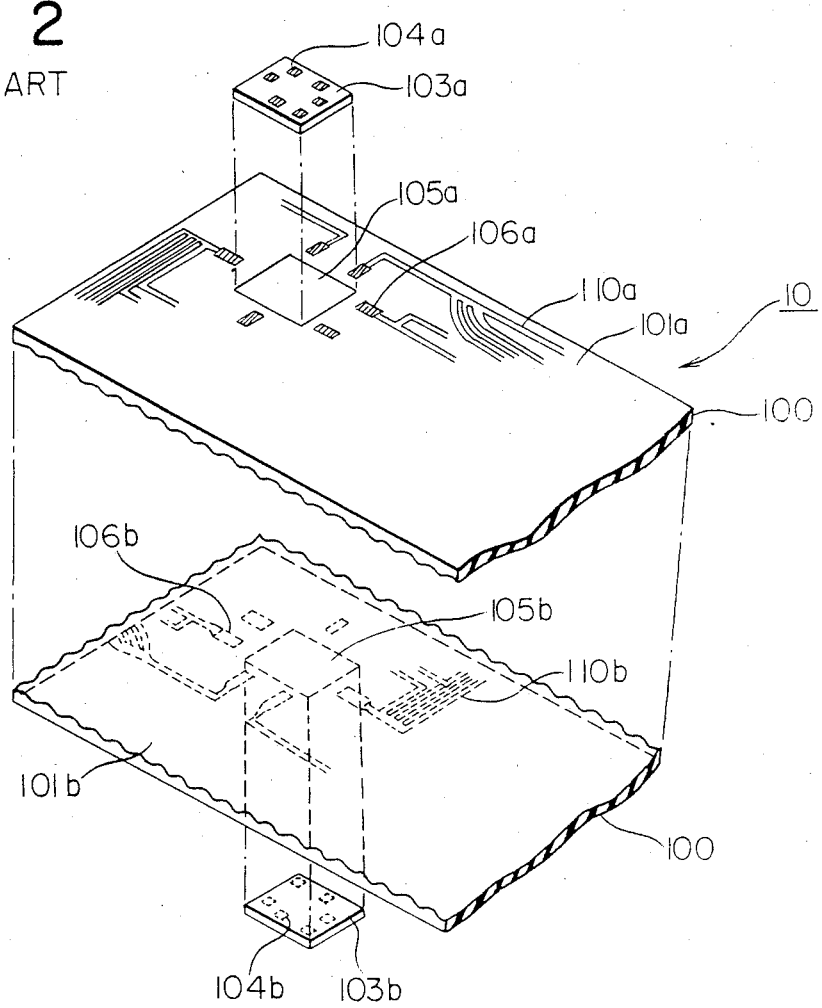
FIG. 2 is an exploded view showing the relationship between a circuit board and IC chips which constitute an IC module of a conventional IC card.
Figure 3:
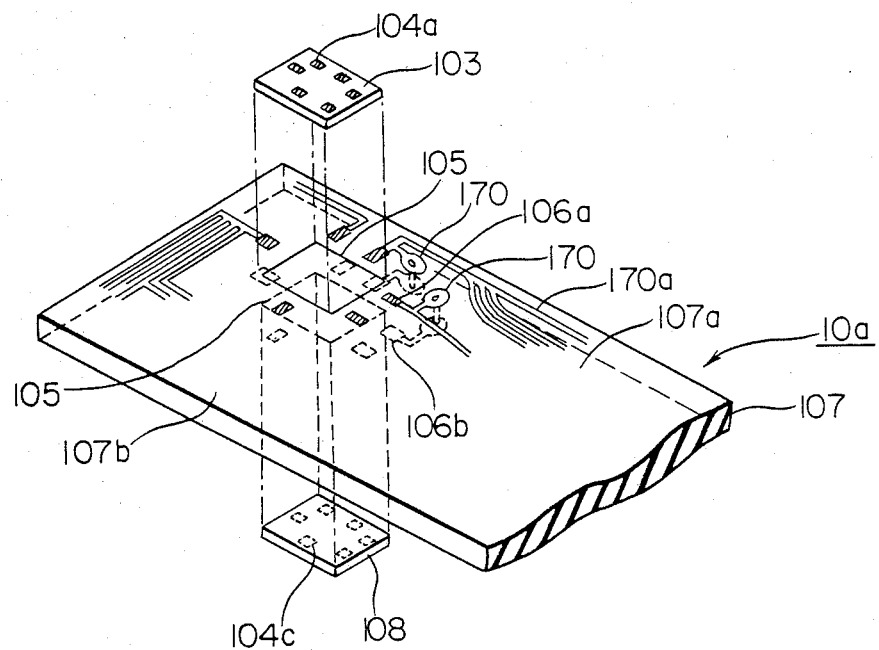
FIG. 3 is a perspective view showing the relationship between a circuit board and IC chips of an IC module in an IC card in accordance with an embodiment of the present invention.

An embodiment of the present invention will be described below with reference to the accompanying drawings. FIG. 3 shows an IC module 10a in accordance with an embodiment of the present invention, where a pair of IC chips 103 and 108 provides the same functions but has circuit patterns that are inverted relative to each other. IC chip die-bond areas 105 are defined at corresponding positions on an upper face 107a and a lower face 107b of a circuit board 107. The IC chips 103 and 108 are mounted back to back on the upper face 107a and lower face 107b of the circuit board 107, respectively, so that their circuit patterns, including wire-bonding pads 104a and 104c thereon, coincide with each other. Therefore as is clear from FIG. 3, the circuit patterns on both sides of a circuit board 107, including the IC chips 103 and 108, exhibit the same dimensions and same geometries when seen through the board. Wire-bonding pads 106a and 106b which are to be connected to those of the IC chips are formed on both faces of the circuit board, and the wire-bonding pads 106b disposed on the lower face 107b where there is no pattern corresponding to a circuit pattern 170a are connected to desired points of the wiring on the upper face 107a via board through holes 170 formed in the circuit board 107. Further, since the pads 106a and 106b are disposed at corresponding positions on both sides of the circuit board, each of the wire-bonding pads 104c on the IC chip 108 mounted on the lower side 107b may be directly connected, except for the pads and lines for the IC chip selecting signals, to each of corresponding wire-bonding pads 106a on the upper side 107a via the board through holes 170, respectively, so that the wire-bonding pads 106a may be used in common for the circuits on both sides. In this case, there is no need for the provision of wire-bonding pads 106b on the lower face 107b other than that for the chip selecting signal (not shown in FIG. 3). As shown in FIG. 3, the circuit board 107 exhibits corresponding patterns on both sides thereof around the IC chips except for the pads and lines for the chip selecting signal. The circuit pattern 170a formed on the upper face 107a is used in common for the circuit on the lower face 107b.

In the thus constructed IC module in accordance with the present invention, since a pair of IC chips having the same functions but having inverted circuit patterns are mounted on both sides of the circuit board 107, it is found that the circuit patterns formed on both sides of the board will coincide with each other as viewed from one of the two sides thereof. Therefore, when the wire-bonding pads 106a and 106b are connected to a common functional signal line via the board through holes 170, it is not necessary to provide wiring (printed circuit patterns) independently or separately for the patterns on the circuit board 107 with respect to both sides thereof. In the case of memory IC chips since signals other than the IC chip selecting signal can be used in common for the IC chips mounted on both sides of the circuit board, the efficiency in terms of pattern wiring can be remarkably increased. For this reason, in regard to the circuit patterns on the circuit board, there is no need for the provision of independent patterns on both sides except for the die-bonding patterns and the wire-bonding patterns (wire-bonding patterns other than that for the wire-bonding pads for the selecting signal terminals may be formed on only one of the two sides but can be used in common for both sides, if necessary), thus enabling simple wiring on only one of the two sides of the circuit board.

The above-described embodiment exemplifies the case of IC chips, but the present invention is also effective when it is applied to a case in which packaged ICs which have the same functions but have circuit patterns inverted relative to each other are mounted on both sides of a circuit board.

Further, the above-described embodiment exemplifies the case where the printed wiring is formed only on one of the two sides of the circuit board, but this invention also includes cases where separated printed circuit patterns for different objectives are respectively formed on both sides of the circuit board and independently used.

In accordance with the present invention, as described above, IC chips or the like having inverted circuit patterns are mounted on both sides of a circuit board, thereby enabling the wiring on the circuit board to be used in common with respect to the two sides thereof, and enabling the amount of pattern wiring to be reduced by eliminating wiring on one of the two sides. The pairs of IC chips or the like can be disposed on both sides of the circuit board at positions corresponding to each other and can be connected to each other via respective boad through holes. It is therefore possible to mount the ICs on both sides of a circuit board at a high density, eliminating the need for any conventional type of multilayer board, so that a low-cost IC card having a reduced thickness increased capacity can be produced.

What is claimed is:

1. An IC card having a card main body and an IC module embedded in said card main body, said IC module comprising:
   a circuit board having an obverse side and a reverse side;
   at least one pair of IC chips performing similar functions with inverted operating circuit patterns and mounted back-to-back on the obverse and reserve sides of said circuit board at a desired position such that the inverted operating circuit pattern of one chip coincides with that of the other as seen through the circuit board;
   at least one circuit board pattern corresponding to one of the operating circuit patterns and printed on one of the obverse and reverse sides of said circuit board, said circuit board pattern being used in common for said pair of IC chips;
   wire-bonding pads formed around peripheries of said pair of IC chips to connect said circuit board pattern to terminals of said pair of IC chips;
   at least one board through hole connecting said wire-bonding pads on one side of said circuit board to the other; and
   a pair of IC chip selecting signal lines provided for said pair of IC chips.

2. An IC card according to claim 1 wherein said wire-bonding pads for said pair of IC chips are formed on only one side of said circuit board and used in common for said pair of IC chips.

3. An IC card according to claim 1 wherein a pair of independent or separated circuit board patterns are formed on both the obverse and reverse sides of said circuit board and used in common for both sides thereof.

4. An IC card according to claim 3 wherein said wire-bonding pads for said pair of IC chips are formed on only one side of said circuit board and used in common for said pair of IC chips.

* * * * *